(12) United States Patent
Toda

(10) Patent No.: US 6,717,983 B1
(45) Date of Patent: Apr. 6, 2004

(54) ULTRASONIC CODING MODEM FOR DIGITAL NETWORK COMMUNICATION

(76) Inventor: Kohji Toda, 1-49-18 Futaba, Yokosuka 239-0814 (JP)

(*) Notice: Subject to any disclaimer, the term of this patent is extended or adjusted under 35 U.S.C. 154(b) by 707 days.

(21) Appl. No.: 09/665,446

(22) Filed: Sep. 19, 2000

(51) Int. Cl.[7] ................................................. H04B 1/38
(52) U.S. Cl. ...................... 375/222; 375/141; 375/153; 367/135; 367/137
(58) Field of Search ................................. 375/140, 141, 375/143, 146, 147, 150, 151, 152, 153, 219, 222, 295, 316; 367/87, 135, 137, 903; 333/193

(56) References Cited

U.S. PATENT DOCUMENTS 5,144,592 A * 9/1992 Bonis ........................... 367/87
5,815,055 A * 9/1998 Eguchi et al. ............... 333/193
6,343,049 B1 * 1/2002 Toda ........................... 367/137
6,462,698 B2 * 10/2002 Campbell et al. ............. 342/51

* cited by examiner

Primary Examiner—Chieh M. Fan

(57) ABSTRACT

An ultrasonic coding modem for digital network communication comprises a transmitting device having a first piezoelectric substrate, and a receiving device having a second piezoelectric substrate. If a message digital-signal is applied to the transmitting device, a SAW is excited on the first piezoelectric substrate and is delivered as a coded digital signal into a digital network. On the other hand, if the coded digital-signal is received at the receiving device from the digital network, a SAW is excited on the second piezoelectric substrate. In this time, if the SAW excited on the second piezoelectric substrate is corresponding to the SAW excited on the first piezoelectric substrate, an output digital-signal, which is equivalent to the message digital-signal, is delivered from the receiving device. As a result, it is possible to keep a base-band communication secret.

9 Claims, 7 Drawing Sheets

ULTRASONIC CODING MODEM FOR DIGITAL NETWORK COMMUNICATION

BACKGROUND OF THE INVENTION

1. Field of the Invention

The present invention relates to an ultrasonic coding modem for digital network communication by means of using transmitting- and receiving devices, of which each includes a piezoelectric substrate and an interdigital transducer (IDT) having a coded pattern. The coded pattern of the IDT in the transmitting device is in reverse to that in the receiving device.

2. Description of the Prior Art

In recent years, digitalization techniques on telegraphic communication are in rapid progress. A code division multiple access (CDMA) method is, more especially, powerful for making a transmission speed high in spread spectrum communication. If the CDMA method has a surface acoustic wave (SAW) matched filter, it is possible to make the transmission speed still higher. However, it is difficult for a conventional type of CDMA method with the SAW matched filter to realize a base-band communication because of a coded message-signal in condition of a phase shift keying (PSK) burst-signal. In other words, it is necessary to transduce the PSK burst-signal to a digital pulse signal with a high speed for the base-band communication. In order to make the digital pulse signal, the use of a complicated circuit is unavoidable for the conventional type of CDMA method with the SAW matched filter.

SUMMARY OF THE INVENTION

An object of the present invention is to provide an ultrasonic coding modem for digital network communication comprising a transmitting device and a receiving device.

Another object of the present invention is to provide the transmitting device capable of coding a message digital-signal applied thereto, and delivering a coded digital-signal into a digital network.

Another object of the present invention is to provide the receiving device capable of receiving the coded digital-signal from the digital network, and detecting an output digital-signal corresponding to the message digital-signal.

Another object of the present invention is to provide an ultrasonic coding modem for digital network communication capable of making the coded digital-signal, in the digital network, play a role as a pseudo noise to keep a base-band communication secret.

Another object of the present invention is to provide the transmitting- and receiving devices capable of recognizing each other in the digital network.

Another object of the present invention is to provide an ultrasonic coding modem for digital network communication capable of a low electric power consumption.

Another object of the present invention is to provide an ultrasonic coding modem for digital network communication excellent in durability and manufacturing.

A still other object of the present invention is to provide an ultrasonic coding modem for digital network communication having a small size which is very light in weight and has a simple structure.

According to one aspect of the present invention there is provided an ultrasonic coding modem for digital network communication comprising a transmitting device and a receiving device. The transmitting device consists of an input terminal, a first piezoelectric substrate, an input IDT consisting of at least three interdigital electrode pairs, a first intermediary IDT, an electrode group, a synchronizing device, an envelope detecting device, and an output terminal. The receiving device consists of a receiving terminal, a second piezoelectric substrate, a second intermediary IDT, an output IDT, and a detecting terminal. The input IDT having a coded pattern, the first intermediary IDT, and the electrode group are formed on the first piezoelectric substrate. The electrode group consists of two IDTs and a central IDT between the two IDTs. The synchronizing device is connected between the first intermediary IDT and one of the two IDTs of the electrode group. The envelope detecting device is connected with the central IDT of the electrode group. The output IDT has a coded pattern in reverse to the input IDT. The second intermediary IDT and the output IDT are formed on the second piezoelectric substrate.

When a pulse (1) of a message digital-signal is applied to the input IDT via the input terminal, a SAW is excited on the first piezoelectric substrate, and then, a coded burst-signal corresponding to the SAW is detected at the first intermediary IDT. The coded burst-signal arrives at the two IDTs of the electrode group simultaneously, and two SAWs are excited on the first piezoelectric substrate, respectively. When the two SAWs are transmitted to the envelope detecting device via the central IDT of the electrode group, a coded digital-signal occurs. Thus, the coded digital-signal is delivered from the output terminal into a digital network. On the other hand, if the coded digital-signal is received at the second intermediary IDT via the receiving terminal from the digital network, a SAW is excited on the second piezoelectric substrate. In this time, the SAW excited at the second intermediary IDT corresponds to the SAW excited at the input IDT, a decoded pulse (1) is detected at the output IDT. Thus, an output digital-signal, which is composed of the decoded pulse (1) and no detected pulse (0), and is equivalent to the message digital-signal, is delivered at the detecting terminal.

According to another aspect of the present invention there are provided input- and output IDTs, of which coded patterns are changed in accordance with a designated time region, respectively.

According to another aspect of the present invention there is provided a transmitting device, wherein a transmitting direction of the SAW excited at the input IDT is orthogonal to that of the two SAWs excited at the two IDTs of the electrode group.

According to another aspect of the present invention there are provided first- and second piezoelectric substrates made of a piezoelectric ceramic, respectively, the polarization axis thereof being parallel to the thickness direction thereof.

According to another aspect of the present invention there are provided first- and second input IDTs in place of the input IDT, and first-and second output IDTs in place of the output IDT. The first input IDT consists of at least three interdigital electrode pairs, and has one coded pattern. The second input IDT consists of at least three interdigital electrode pairs, and has another coded pattern. The first output IDT has a coded pattern in reverse to the first input IDT. The second output IDT has a coded pattern in reverse to the second input IDT.

When pulses (0 and 1) of a message digital-signal are applied to the first- and second input IDTs, respectively, via the input terminal, first- and second SAWs are excited on the first piezoelectric substrate. And then, a coded burst-signal corresponding to the first- and second SAWs, respectively, is detected at the first intermediary IDT. The coded burst-signal arrives at the two IDTs of the electrode group simultaneously, and third- and fourth SAWs are excited on the first piezoelectric substrate, respectively. When the third- and fourth SAWs are transmitted to the envelope detecting device via the central IDT of the electrode group, a coded digital-signal occurs. Thus, the coded digital-signal is delivered from the output terminal into a digital network. On the other hand, if the coded digital-signal is received at the second intermediary IDT via the receiving terminal from the digital network, a fifth SAW is excited on the second piezoelectric substrate. In this time, the fifth SAW corresponds to the first- and second SAWs, respectively, decoded pulses (0 and 1) are detected at the first- and second output IDTs, respectively. Thus, an output digital-signal, which is based on the decoded pulses (0 and 1) and is equivalent to the message digital-signal, is delivered at the detecting terminal.

According to another aspect of the present invention there are provided first- and second input IDTs, of which each coded pattern is changed in accordance with a designated time region, and in the same time, first- and second output IDTs, of which each coded pattern is changed in accordance with a designated time region.

According to other aspect of the present invention there is provided a transmitting device, wherein a transmitting direction of the first- and second SAWs is orthogonal to that of the third- and fourth SAWs.

According to a further aspect of the present invention there is provided a third input IDT, by which the first- and second input IDTs are replaced. The third input IDT has two coded patterns, which are exchanged from each other in response to the pulses (0 and 1) of the message digital-signal applied to the input IDT.

BRIEF DESCRIPTION OF THE DRAWINGS

Other features and advantages of the invention will be clarified from the following description with reference to the attached drawings.

DETAILED DESCRIPTION OF THE PRESENTLY PREFERRED EXEMPLARY EMBODIMENTS

Figure 1:
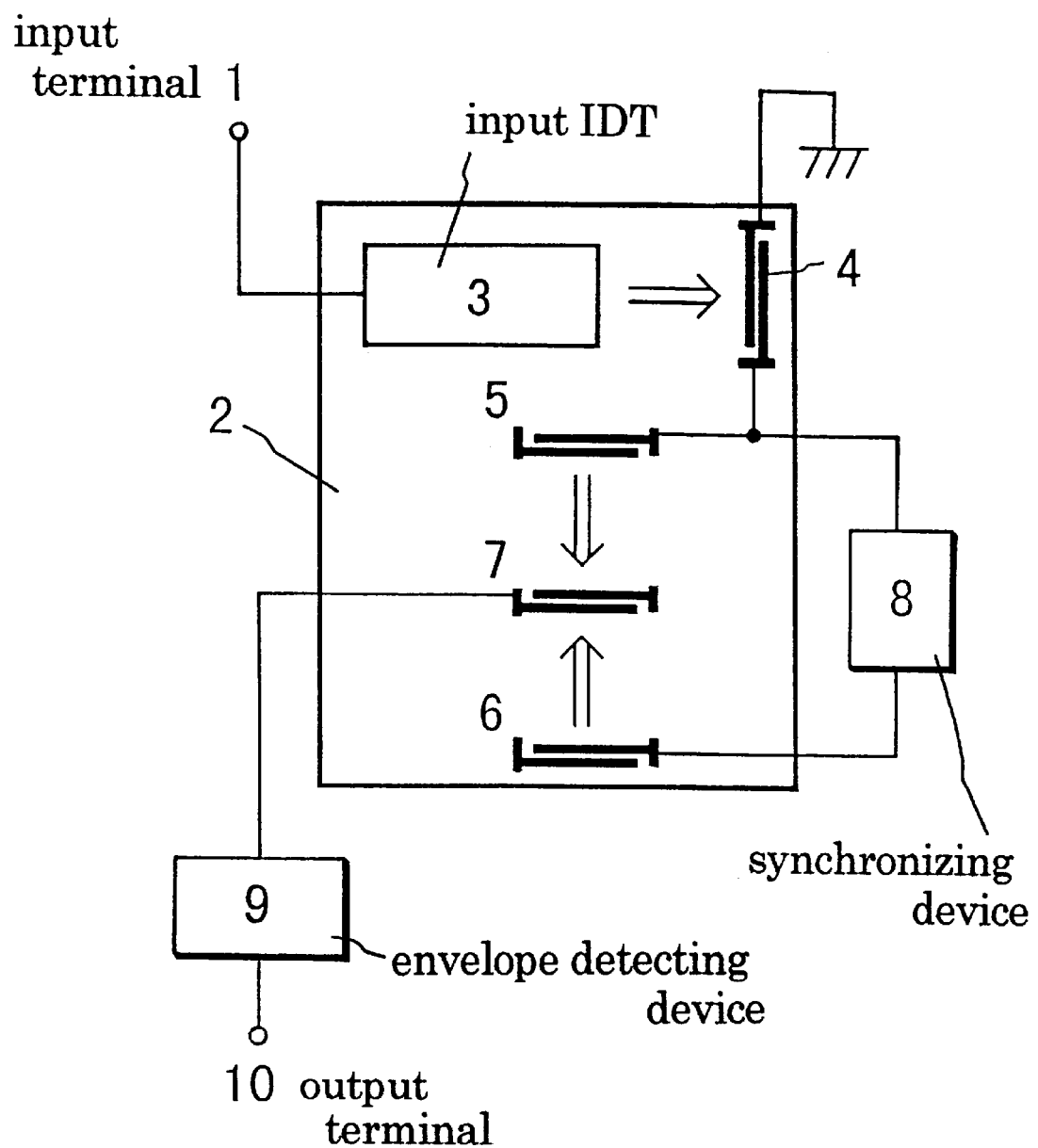
FIG. 1 shows a schematic illustration of a transmitting device, included in an ultrasonic coding modem for digital network communication, according to a first embodiment of the present invention.

FIG. 1 shows a schematic illustration of a transmitting device, included in an ultrasonic coding modem for digital network communication, according to a first embodiment of the present invention. The transmitting device comprises input terminal 1, first piezoelectric substrate 2, input IDT 3, first intermediary IDT 4, IDT 5, IDT 6, central IDT 7, synchronizing device 8, envelope detecting device 9, and output terminal 10. IDT 5, IDT 6, and central IDT 7 form an electrode group. First piezoelectric substrate 2 is made of a piezoelectric ceramic thin plate with a dimension of 200 $\mu$m in thickness, and the polarization axis thereof is parallel to the thickness direction thereof. Input IDT 3, first intermediary IDT 4, and the electrode group, made of an aluminum thin film, respectively, are formed on first piezoelectric substrate 2. First intermediary IDT 4, IDT 5, IDT 6, and central IDT 7 have an interdigital periodicity of 40 $\mu$m, respectively.

Figure 2:
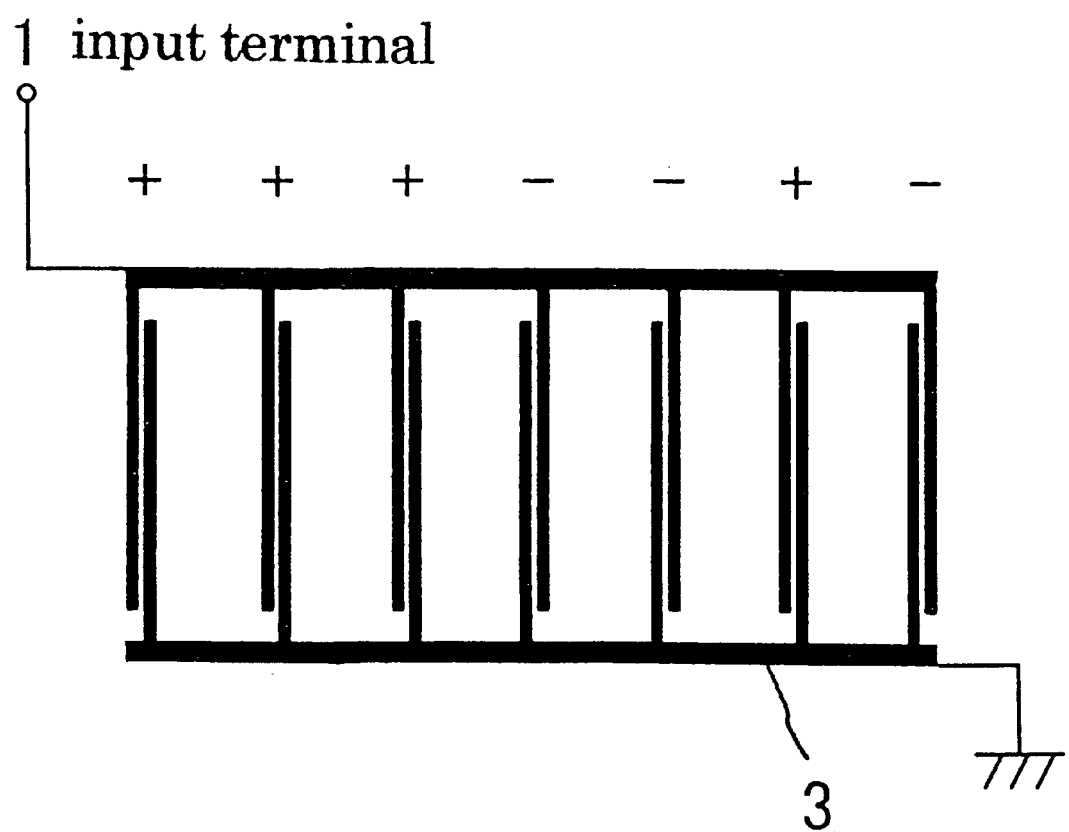
FIG. 2 shows a plan view of input IDT 3, which consists of seven interdigital electrode pairs.

FIG. 2 shows a plan view of input IDT 3, which consists of seven interdigital electrode pairs. Each pair has an interdigital periodicity of 40 $\mu$m. Input IDT 3 has a coded pattern based on the Baker code. Besides a seven-digits code (1, 1, 1, 0, 0, 1, 0) as shown in FIG. 2, for example, a three-digits code (1, 1, 0), an eleven-digits code (1, 1, 1, 0, 0, 0, 1, 0, 0, 1, 0), and others are available.

Figure 3:
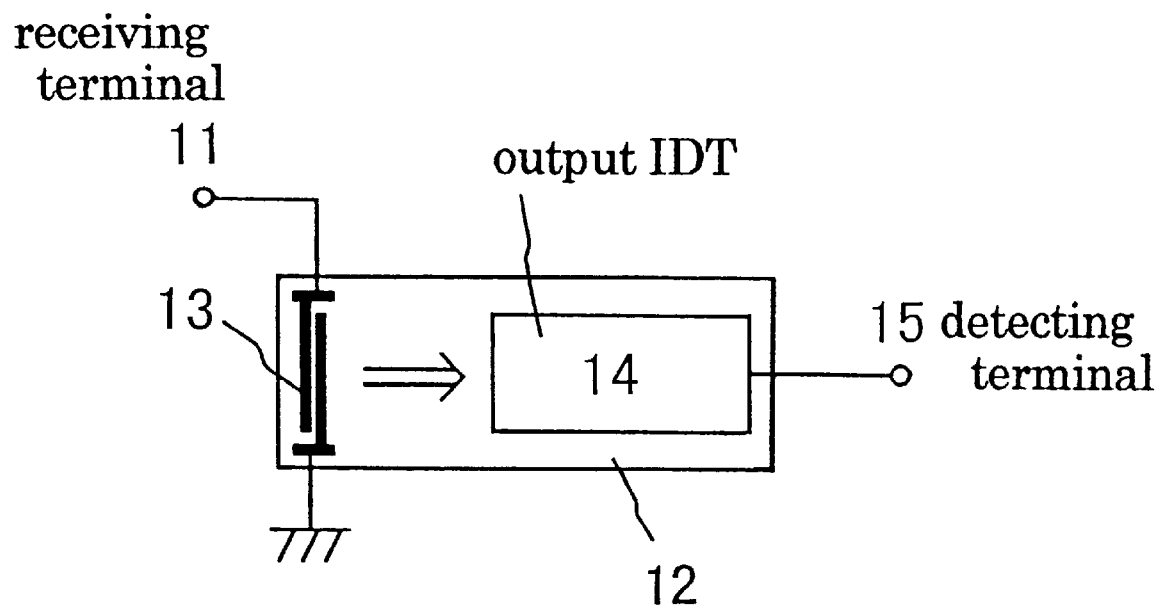
FIG. 3 shows a schematic illustration of a receiving device, included in the ultrasonic coding modem for digital network communication, according to a first embodiment of the present invention.

FIG. 3 shows a schematic illustration of a receiving device, included in the ultrasonic coding modem for digital network communication, according to a first embodiment of the present invention. The receiving device comprises receiving terminal 11, second piezoelectric substrate 12, second intermediary IDT 13, output IDT 14 having a coded pattern in reverse to input IDT 3, and detecting terminal 15. Second piezoelectric substrate 12 is made of a piezoelectric ceramic thin plate with a dimension of 200 $\mu$m in thickness, and the polarization axis thereof is parallel to the thickness direction thereof. Second intermediary IDT 13 and output IDT 14, made of an aluminum thin film, respectively, are formed on second piezoelectric substrate 12. Second intermediary IDT, and seven interdigital electrode pairs of output IDT 14 have an interdigital periodicity of 40 $\mu$m, respectively.

In the ultrasonic coding modem for digital network communication composed of the transmitting device in FIG. 1 and the receiving device in FIG. 3, if a message digital-signal composed of pulses (0 and 1) is applied to input terminal 1, only each pulse (1) of the message digital-signal is received at input IDT 3, because each pulse (0) of the message digital-signal can not be essentially detected at any IDT. For example, a message digital-signal ( composed of pulses 1, 1, 0 , 1, 0, and 1) is applied to input terminal 1, input IDT 3 receives a first pulse (1), a second pulse (1), a little later a third pulse (1), and a little later a fourth pulse (1) in turn. When input IDT 3 receives each pulse (1) of the message digital-signal, a SAW corresponding to the coded pattern of input IDT 3 is excited on first piezoelectric substrate 2. Because input IDT 3 has seven interdigital electrode pairs, the SAW is detected, at first intermediary IDT 4, as a coded burst-signal, that is, a coded row of seven bursts. The coded burst-signal is transmitted to IDT 5 and IDT 6, respectively. And then, two SAWs are excited at IDT 5 and IDT 6, respectively, on first piezoelectric substrate 2. Because synchronizing device 8 is arranged between first intermediary IDT 4 and IDT 6, and in addition, envelope detecting device 9 is connected with central IDT 7, a coded digital-signal, that is, a coded row of seven digital-pulses, is obtained at envelope detecting device 9 via central IDT 7 from the two SAWs excited at IDT 5 and IDT 6. The synchronizing device 8, consisting of a full wave rectifier and a monostable multivibrator, is for the provision of timing information. It is noted that the polarity of the dc pulse signal obtained for synchronization is independent of the phase polarity of the transmitting signal. Thus, each pulse (1) of the message digital-signal is transduced to the coded digital-signal. The coded digital-signal is delivered from output terminal 10 into a digital network. As a result, it is possible to transmit the message-digital signal as the coded digital-signal by using the transmitting device, which has a simple structure with s small size. On the other hand, if the coded digital-signal is received at second intermediary IDT 13 via receiving terminal 11 from the digital network, a SAW is excited on second piezoelectric substrate 12. The SAW excited at second intermediary IDT 13 arrives at output IDT 14. In this time, if the SAW excited at second intermediary IDT 13 is corresponding to the SAW excited at input IDT 3, a decoded pulse (1) is detected at output IDT 14, which has an ability as a SAW matched filter. In other words, the coded digital-signal is transduced to the decoded pulse (1). Thus, an output digital-signal, which is composed of the decoded pulse (1) and no detected pulse (0) and is equivalent to the message digital-signal, is delivered from detecting terminal 15. Accordingly, it is possible to detect the output digital-signal at detecting terminal 15 without influence of noises by using the receiving device, which has a simple structure with a small size. In addition, because of a coding function of the transmitting device and a decoding function of the receiving device, it is possible to make the coded digital-signal, in the digital network, play a role as a pseudo noise to keep a base-band communication secret. Moreover, it is possible for the transmitting device and the receiving device to recognize each other in the digital network. The incorporation of the SAW devices in the present digital communication system is characterized as follows: (a) real time synchronization, (b) simple system construction.

Figure 4:
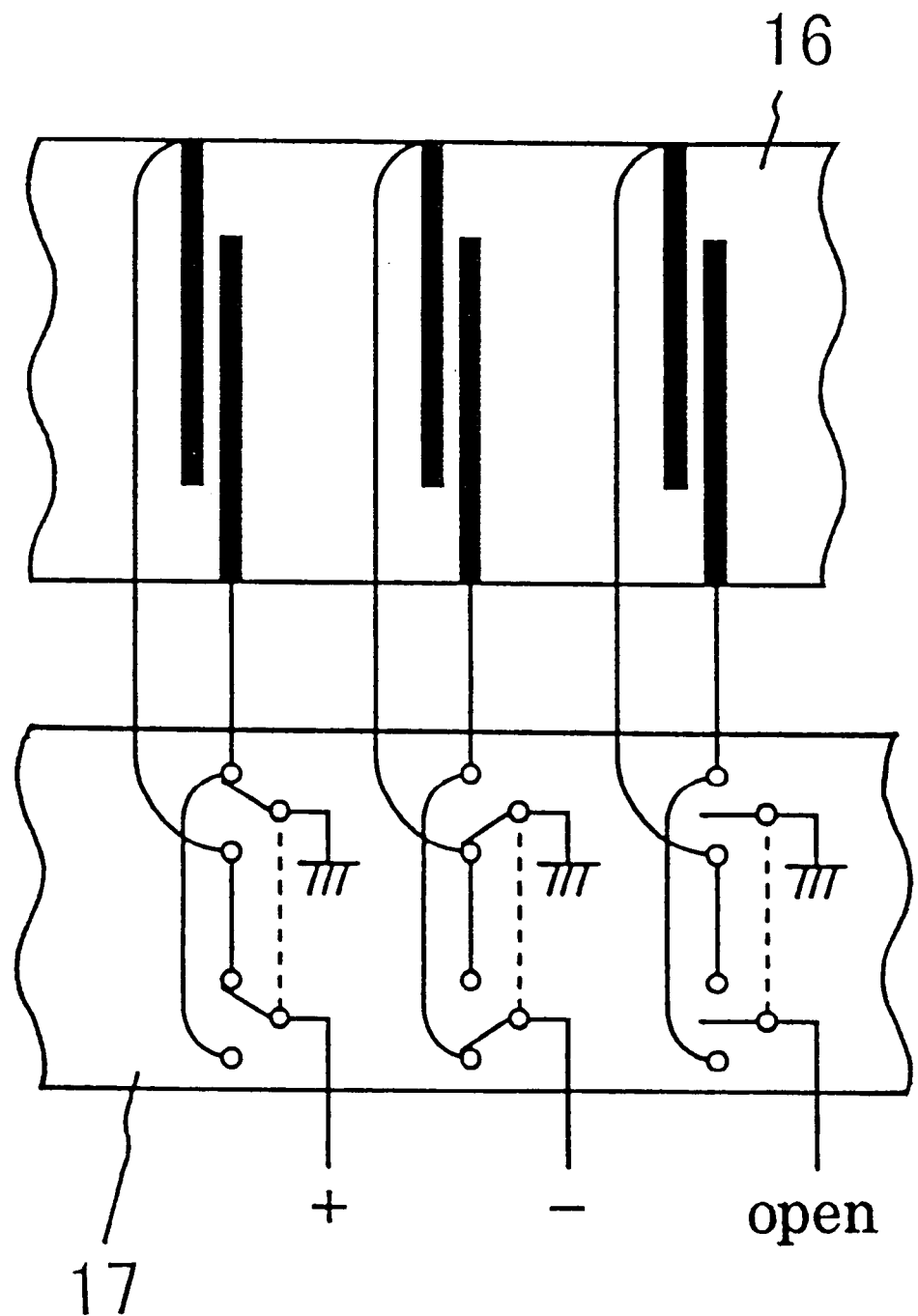
FIG. 4 shows a fragmentary plan view of another input IDT 16, which is used in place of input IDT 3.

FIG. 4 shows a fragmentary plan view of another input IDT 16, which is used in place of input IDT 3. Input IDT 16 consists of seven interdigital electrode pairs. Each pair has an interdigital periodicity of 40 μm. Input IDT 16 has a coded pattern, which is changed in accordance with a designated time region by using switch 17. At the same time, the coded pattern of output IDT 14 in FIG. 3 is also changed in response to that of input IDT 16. Such a coded-pattern change in accordance with a designated time region keeps a base-band communication more secret.

In the transmitting device in FIG. 1, a transmitting direction of the SAW excited at input IDT 3 is orthogonal to that of the two SAWs excited at IDT 5 and IDT 6, respectively. However, it is possible to arrange IDT 5, IDT 6, and central IDT 7 in order that the transmitting direction of the SAW excited at input IDT 3 is parallel to that of the two SAWs excited at IDT 5 and IDT 6, respectively.

Figure 5:
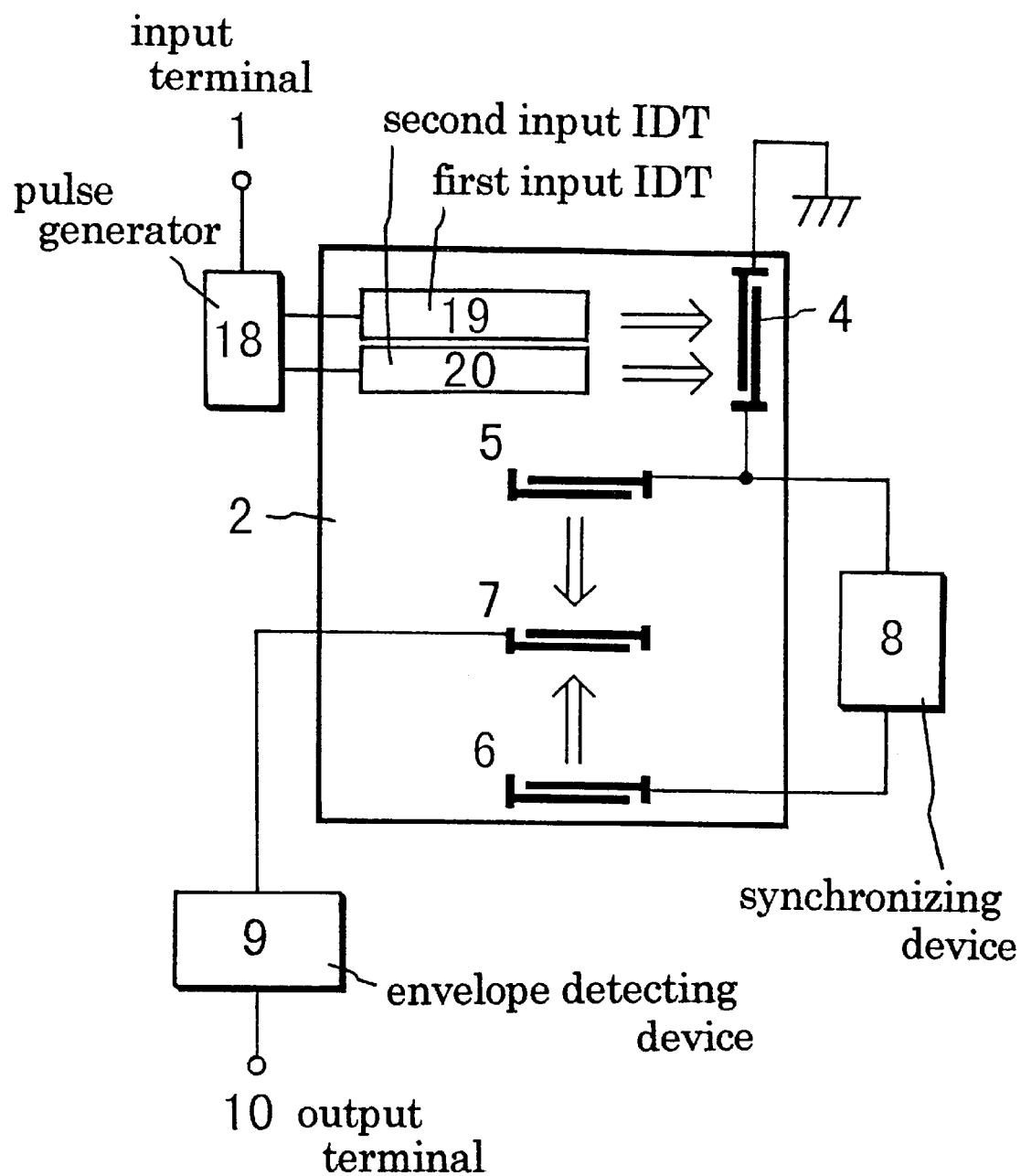
FIG. 5 shows a schematic illustration of a transmitting device according to a second embodiment of the present invention.

FIG. 5 shows a schematic illustration of a transmitting device according to a second embodiment of the present invention. The transmitting device has the same construction as FIG. 1, except for further comprising pulse generator 18 and using first input IDT 19 and second input IDT 20, which are in place of input IDT 3. First input IDT 19 consists of seven interdigital electrode pairs, and has a coded pattern as shown in FIG. 2. Second input IDT 20 consisting of seven interdigital electrode pairs, has a different coded pattern from first input IDT 19.

Figure 6:
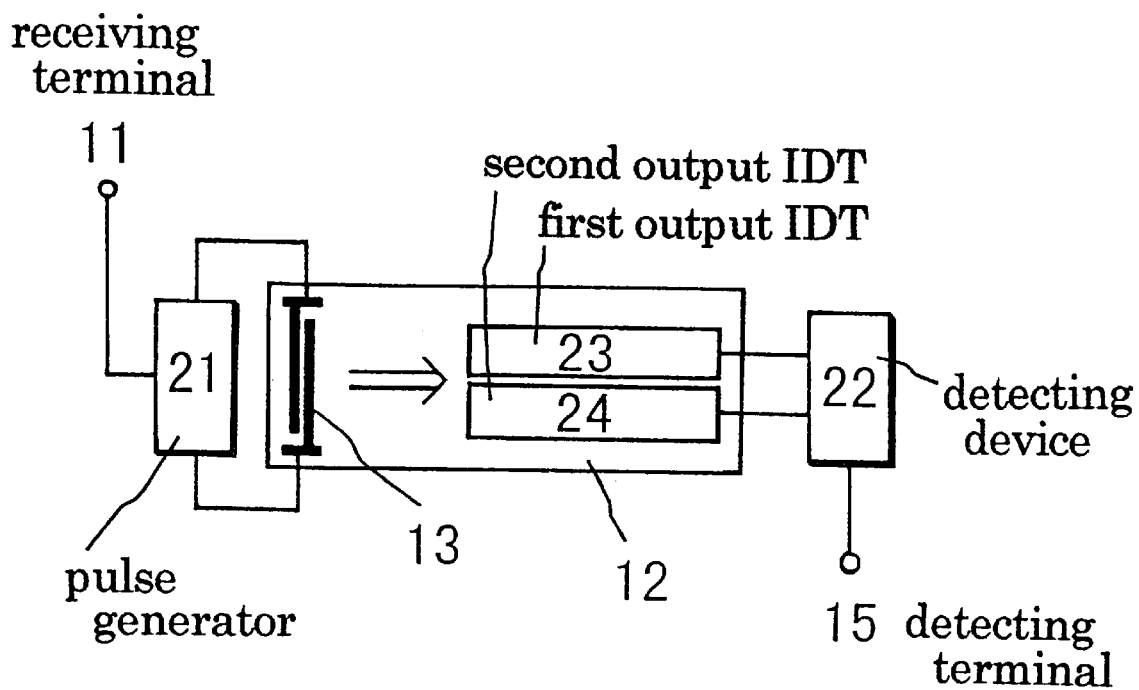
FIG. 6 shows a schematic illustration of a receiving device according to a second embodiment of the present invention.

FIG. 6 shows a schematic illustration of a receiving device according to a second embodiment of the present invention. The receiving device has the same construction as FIG. 3, except for further comprising pulse generator 21 and detecting device 22, and using first output IDT 23 and second output IDT 24, which are in place of output IDT 14.

First output IDT 23 has a coded pattern in reverse to first input IDT 19. Second output IDT 24 has a coded pattern in reverse to second input IDT 20.

In the ultrasonic coding modem for digital network communication composed of the transmitting device in FIG. 5 and the receiving device in FIG. 6, if a message digital-signal is applied to pulse generator 18 via input terminal 1, first- and second timing pulses, which are corresponding to pulses (0 and 1) of the message digital-signal, respectively, are generated. The pulse (0) of the message digital-signal can not be essentially detected at any IDT. Therefore, pulse generator 18 is necessary. Thus, pulse generator 18 generates the first- and second timing pulses, which can be sensed by first input IDT 19 and second input IDT 20, respectively. When the first- and second timing pulses are applied to first input IDT 19 and second input IDT 20, respectively, first- and second SAWs corresponding to the coded pattern of first input IDT 19 and second input IDT 20, respectively, are excited on first piezoelectric substrate 2. The first- and second SAWs are detected at first intermediary IDT 4 as first- and second coded burst-signals, respectively. When the first coded burst-signal is transmitted to IDT 5 and IDT 6, third- and fourth SAWs are excited at IDT 5 and IDT 6, respectively, on first piezoelectric substrate 2, and a first coded digital-signal is obtained at envelope detecting device 9 via central IDT 7. The first coded digital-signal is delivered from output terminal 10 into a digital network. In the same way, when the second coded burst-signal is transmitted to IDT 5 and IDT 6, third- and fourth SAWs are excited at IDT 5 and IDT 6, respectively, on first piezoelectric substrate 2, and then, a second coded digital-signal is obtained at envelope detecting device 9 via central IDT 7, and delivered from output terminal 10 into the digital network. On the other hand, if the first coded digital-signal, that is, the coded row of seven digital-pulses, is received at pulse generator 21 via receiving terminal 11 from the digital network, third- and fourth timing pulses are generated. The third- and fourth timing pulses are corresponding to the digital pulses (0 and 1), respectively, of the coded row, and are sensible for first output IDT 23 and second output IDT 24, respectively. In the same way, if the second coded digital-signal is received at pulse generator 21, the third- and fourth timing pulses are generated. When a row of the third- and fourth timing pulses is applied to second intermediary IDT 13, a fifth SAW is excited on second piezoelectric substrate 12. In this time, if the fifth SAW is corresponding to the first SAW, a decoded pulse (0) is detected at first output IDT 23. If the fifth SAW is corresponding to the second SAW, a decoded pulse (1) is detected at second output IDT 24. Thus, the first- and second coded digital-signals are transduced to the decoded pulses (0 and 1), respectively, which are transmitted to detecting device 22. And then, an output digital-signal, which is composed of the decoded pulses (0 and 1) and is equivalent to the message digital-signal, is delivered from detecting terminal 15 via detecting device 22.

Figure 7:
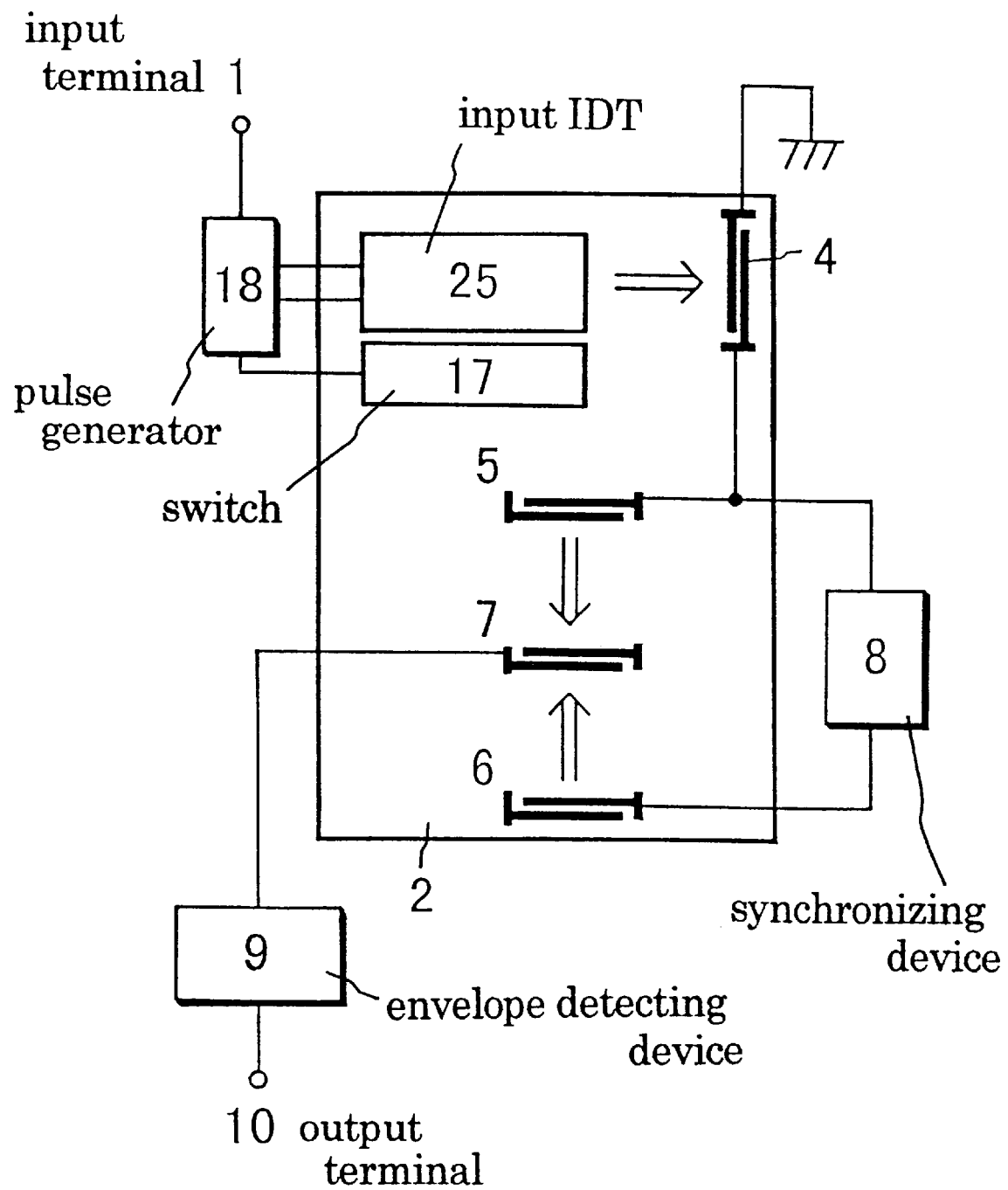
FIG. 7 shows a schematic illustration of a transmitting device according to a third embodiment of the present invention.

FIG. 7 shows a schematic illustration of a transmitting device according to a third embodiment of the present invention. The transmitting device has the same construction as FIG. 5, except for further comprising input IDT 25 in place of first input IDT 19 and second input IDT 20. Input IDT 25, consisting of seven interdigital electrode pairs, has two coded patterns, which are exchanged from each other, by switch 17 shown in FIG. 4, in response to pulses (0 and 1) of a message digital-signal applied to input IDT 25.

In the ultrasonic coding modem for digital network communication composed of the transmitting device in FIG. 7 and the receiving device in FIG. 6, if the message digital-signal is applied to pulse generator 18 via input terminal 1, first- and second timing pulses, which are corresponding to pulses (0 and 1) of the message digital-signal, respectively, are generated. When the first- and second timing pulses arrive at input IDT 25, respectively, the interdigital electrode pairs of input IDT 25 are reconstructed to have one- and the other coded patterns, respectively. Thus, input IDT 25 receives the first- and second timing pulses, respectively, and in this time, first- and second SAWs are excited on first piezoelectric substrate 2, respectively. Therefore, the use of input IDT 25 brings about the same coding effect as that of first input IDT 19 and second input IDT 20.

While this invention has been described in connection with what is presently considered to be the most practical and preferred embodiment, it is to be understood that the invention is not limited to the disclosed embodiment, but, on the contrary, is intended to cover various modifications and equivalent arrangements included within the spirit and scope of the appended claims.

What is claimed is:

1. An ultrasonic coding modem for digital network communication comprising:
   a transmitting device consisting of
   an input terminal,
   a first piezoelectric substrate,
   an input IDT consisting of at least three interdigital electrode pairs, and having a coded pattern,
   a first intermediary IDT,
   an electrode group consisting of two IDTs and a central IDT between said two IDTs, said input IDT, said first intermediary IDT, and said electrode group being formed on said first piezoelectric substrate,
   a synchronizing device connected between said first intermediary IDT and one of said two IDTs of said electrode group,
   an envelope detecting device connected with said central IDT of said electrode group,
   an output terminal; and
   a receiving device consisting of
   a receiving terminal,
   a second piezoelectric substrate,
   a second intermediary IDT,
   an output IDT having a coded pattern in reverse to said input IDT, said second intermediary IDT and said output IDT being formed on said second piezoelectric substrate, and
   a detecting terminal,
      said input IDT exciting a SAW on said first piezoelectric substrate only when receiving a pulse (1) of a message digital-signal via said input terminal,
      said first intermediary IDT detecting a coded burst-signal corresponding to said SAW excited at said input IDT,
      said two IDTs of said electrode group receiving said coded burst-signal simultaneously, and exciting two SAWs on said first piezoelectric substrate, respectively,
      said central IDT of said electrode group receiving said two SAWs simultaneously,
      said envelope detecting device causing a coded digital-signal from said two SAWs,
      said output terminal delivering said coded digital-signal into a digital network,
      said second intermediary IDT exciting a SAW on said second piezoelectric substrate only when receiving said coded digital-signal from said digital network via said receiving terminal,
      said output IDT detecting a decoded pulse (1), if said SAW excited at said second intermediary IDT corresponds to said SAW excited at said input IDT,
      said detecting terminal delivering an output digital-signal, which is composed of said decoded pulse (1) and no detected pulse (0), and is equivalent to said message digital-signal.

2. An ultrasonic coding modem for digital network communication as defined in claim 1, wherein said coded pattern of said input- and output IDTs, respectively, is changed in accordance with a designated time region.

3. An ultrasonic coding modem for digital network communication as defined in claim 1, wherein a transmitting direction of said SAW excited at said input IDT is orthogonal to that of said two SAWs excited at said two IDTs of said electrode group.

4. An ultrasonic coding modem for digital network communication as defined in claim 1, wherein said first- and second piezoelectric substrates are made of a piezoelectric ceramic, respectively, the polarization axis thereof being parallel to the thickness direction thereof.

5. An ultrasonic coding modem for digital network communication comprising:
   a transmitting device consisting of
   an input terminal,
   a first piezoelectric substrate,
   a first input IDT consisting of at least three interdigital electrode pairs, and having one coded pattern,
   a second input IDT consisting of at least three interdigital electrode pairs, and having another coded pattern,
   a first intermediary IDT,
   an electrode group consisting of two IDTs and a central IDT between said two IDTs, said first- and second input IDTs, said first intermediary IDT, and said electrode group being formed on said first piezoelectric substrate,
   a synchronizing device connected between said first intermediary IDT and one of said two IDTs of said electrode group,
   an envelope detecting device connected with said central IDT of said electrode group,
   an output terminal; and
   a receiving device consisting of
   a receiving terminal,
   a second piezoelectric substrate,
   a second intermediary IDT,
   a first output IDT having a coded pattern in reverse to said first input IDT,
   a second output IDT having a coded pattern in reverse to said second input IDT, said second intermediary IDT and said first- and second output IDTs being formed on said second piezoelectric substrate, and
   a detecting terminal,
      said input terminal receiving a message digital-signal,
      said first- and second input IDTs exciting first- and second SAWs, respectively, on said first piezoelectric substrate when receiving pulses (0 and 1), respectively, of a message digital-signal via said input terminal,
      said first intermediary IDT detecting a coded burst-signal corresponding to said first-and second SAWs, respectively,
      said two IDTs of said electrode group receiving said coded burst-signal simultaneously, and exciting third- and fourth SAWs on said first piezoelectric substrate, respectively, said central IDT of said electrode group receiving said third- and fourth SAWs simultaneously, said envelope detecting device causing a coded digital-signal, said output terminal delivering said coded digital-signal into a digital network, said second intermediary IDT exciting a fifth SAW on said second piezoelectric substrate only when receiving said coded digital-signal from said digital network via said receiving terminal, said first- and second output IDTs detecting decoded pulses (0 and 1), respectively, if said fifth SAW corresponds to said first- and second SAWs, respectively, said detecting terminal delivering an output digital-signal, which is based on said decoded pulses (0 and 1) and is equivalent to said message digital-signal.

6. An ultrasonic coding modem for digital network communication as defined in claim 5, wherein the coded patterns of said first- and second input IDTs, respectively, is changed in accordance with a designated time region, and the coded patterns of said first- and second output IDTs, respectively, is changed in accordance with a designated time region.

7. An ultrasonic coding modem for digital network communication as defined in claim 5, wherein a transmitting direction of said first- and second SAWs is orthogonal to that of said third- and fourth SAWs.

8. An ultrasonic coding modem for digital network communication as defined in claim 5, wherein said first- and second piezoelectric substrates are made of a piezoelectric ceramic, respectively, the polarization axis thereof being parallel to the thickness direction thereof.

9. An ultrasonic coding modem for digital network communication as defined in claim 5, wherein said first and second input IDTs may be replaced by a third input IDT, said third input IDT having two coded patterns, which are exchanged from each other in response to said pulses (0 and 1) of said message digital-signal applied to said third input IDT.

* * * * *